(12) United States Patent
Machida (10) Patent No.: US 8,829,688 B2
(45) Date of Patent: Sep. 9, 2014

(54) SEMICONDUCTOR DEVICE WITH MEANS FOR PREVENTING SOLDER BRIDGES, AND METHOD FOR MANUFACTURING SEMICONDUCTOR DEVICE

(71) Applicant: Shinko Electric Industries Co., Ltd., Nagano (JP)

(72) Inventor: Yoshihiro Machida, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 8 days.

(21) Appl. No.: 13/680,931

(22) Filed: Nov. 19, 2012

(65) Prior Publication Data

US 2013/0134594 A1    May 30, 2013

(30) Foreign Application Priority Data

Nov. 28, 2011 (JP) .................... 2011-259485

(51) Int. Cl.
*H01L 23/48* (2006.01)
*H01L 23/488* (2006.01)
*H01L 23/00* (2006.01)
*H01L 21/768* (2006.01)

(52) U.S. Cl.
CPC ..... *H01L 23/488* (2013.01); *H01L 2224/14153* (2013.01); *H01L 2224/81191* (2013.01); *H01L 2224/11472* (2013.01); *H01L 2224/0346* (2013.01); *H01L 2224/16237* (2013.01); *H01L 2224/05571* (2013.01); *H01L 2224/141* (2013.01); *H01L 2224/81194* (2013.01); *H01L 2224/13147* (2013.01); *H01L 2224/13166* (2013.01); *H01L 2224/05554* (2013.01); *H01L 24/11* (2013.01); *H01L 2224/1146* (2013.01); *H01L 21/768* (2013.01); *H01L 2224/14155* (2013.01); *H01L 2224/13012* (2013.01); *H01L 24/16* (2013.01); *H01L 2224/11906* (2013.01); *H01L 2224/0401* (2013.01); *H01L 2224/81411* (2013.01); *H01L 24/81* (2013.01); *H01L 2224/13018* (2013.01); *H01L 24/14* (2013.01); *H01L 2224/81815* (2013.01); *H01L 2224/13014* (2013.01); *H01L 2224/11474* (2013.01); *H01L 2224/94* (2013.01); *H01L 2224/13083* (2013.01); *H01L 2224/13076* (2013.01); *H01L 24/13* (2013.01); *H01L 2224/11831* (2013.01)
USPC .......... 257/779; 257/772; 257/778; 257/737; 438/612

(58) Field of Classification Search
CPC .......... H01L 2224/73265; H01L 2224/32225; H01L 2924/15311
USPC ................ 257/734, 772, 773, 775, 777–779; 438/612
See application file for complete search history.

(56) References Cited

U.S. PATENT DOCUMENTS

| | | | |
|---|---|---|---|
| 5,391,439 A | | 2/1995 | Tomita et al. |
| 5,579,207 A | * | 11/1996 | Hayden et al. ................ 361/790 |
| 6,441,316 B1 | * | 8/2002 | Kusui ............................ 174/260 |
| 8,604,625 B1 | * | 12/2013 | Kim et al. ..................... 257/779 |
| 2002/0056741 A1 | * | 5/2002 | Shieh et al. ................ 228/180.5 |
| 2012/0007232 A1 | * | 1/2012 | Haba ............................ 257/737 |

FOREIGN PATENT DOCUMENTS

| | | | | |
|---|---|---|---|---|
| JP | 11-186322 | A | 7/1999 | |
| JP | 11177225 | * | 7/1999 | ............... H05K 3/34 |

* cited by examiner

*Primary Examiner* — Allen L. Parker
*Assistant Examiner* — Gardner W Swan
(74) *Attorney, Agent, or Firm* — Wolf, Greenfield & Sacks, P.C.

(57) ABSTRACT

A semiconductor device includes a semiconductor element on which electrode pads are laid out. A wiring substrate includes connecting pads respectively arranged in correspon- dence with the electrode pads. Pillar-shaped electrode terminals are respectively formed on the electrode pads of the semiconductor element. A solder joint electrically connects a distal portion of each electrode terminal and the corresponding connecting pad on the wiring substrate. Each electrode terminal includes a basal portion, which is connected to the corresponding electrode pad, and a guide, which is formed in the distal portion. The guide has a smaller cross-sectional area than the basal portion as viewed from above. The guide has a circumference and the basal portion has a circumference that is partially flush with the circumference of the guide. The guide is formed to guide solder toward the circumference of the guide.

15 Claims, 7 Drawing Sheets

SEMICONDUCTOR DEVICE WITH MEANS FOR PREVENTING SOLDER BRIDGES, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2011-259485, filed on Nov. 28, 2011, the entire contents of which are incorporated herein by reference.

FIELD

The present disclosure is related to a semiconductor device, a semiconductor element, and a method for manufacturing a semiconductor device.

BACKGROUND

Semiconductor devices incorporated in miniaturized and highly sophisticated electronic devices have become miniaturized, highly densified, and provided with more terminals. The terminals of a semiconductor element include connecting terminals, which are typically connected to a wiring substrate. These terminals have also become miniaturized and densified in accordance with the miniaturization and densification of the semiconductor elements.

One common method for mounting a semiconductor element onto a substrate is flip chip mounting (refer to, for example, Japanese Laid-Open Patent Publication No. 11-186322). The flip chip mounting is implemented by forming protruding electrode terminals (bumps) on a semiconductor element and electrically connecting the bumps, with a conductive material such as solder, directly to pads that are exposed from a protective layer (solder mask layer) on a chip mounting surface of a wiring substrate.

A miniaturized and highly accurate semiconductor element includes bumps arranged with a narrower pitch. This has also narrowed the pitch of corresponding pads. As a result, defects such as solder bridges, which bridge adjacent pads with solder, has a tendency of occurring in such a semiconductor element.

SUMMARY

One aspect of the present invention is a semiconductor device including a semiconductor element on which a plurality of electrode pads are laid out. A wiring substrate includes a plurality of connecting pads respectively arranged in correspondence with the plurality of electrode pads. A plurality of pillar-shaped electrode terminals are respectively formed on the plurality of electrode pads of the semiconductor element. A solder joint electrically connects a distal portion of each electrode terminal and the corresponding connecting pad on the wiring substrate. Each electrode terminal includes a basal portion, which is connected to the corresponding electrode pad, and a guide, which is formed in the distal portion. The guide has a smaller cross-sectional area than the basal portion as viewed from above. The guide has a circumference and the basal portion has a circumference that is partially flush with the circumference of the guide. The guide is formed to guide solder toward the circumference of the guide.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF EMBODIMENTS

One embodiment will now be described with reference to FIGS. 1A to 6B.

Figure 1A:
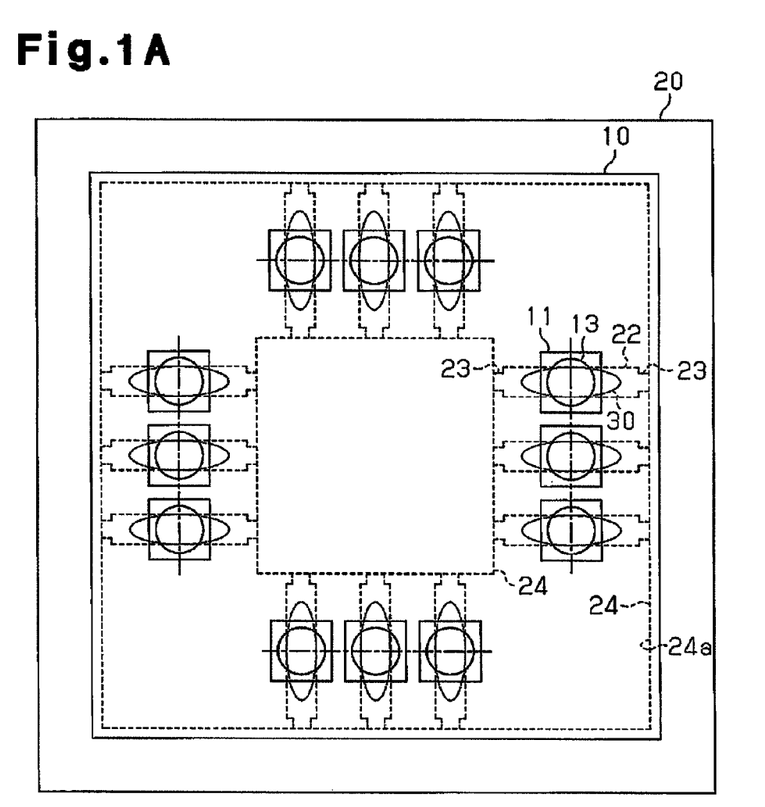
FIG. 1A is a perspective plan view of a semiconductor device.

As illustrated in FIG. 1A, a semiconductor device includes a semiconductor element 10 and a wiring substrate 20 on which the semiconductor element 10 is mounted. The semiconductor element 10 is mounted on an upper surface (refer to FIG. 1B) of the wiring substrate 20.

Figure 1B:
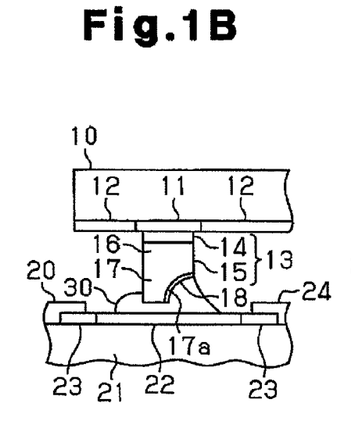
FIGS. 1B to 1D are partially enlarged views of a semiconductor element and a wiring substrate.

As illustrated in FIG. 1A, electrode pads 11 are formed on a surface of the semiconductor element 10 (for example, the surface on which circuit elements are formed, or the lower surface in FIG. 1B). The electrode pads 11 are laid out in a peripheral arrangement that forms a frame-shaped electrode pad array including lines of electrode pads 11 extending along the periphery of the semiconductor element 10. Each electrode pad 11 is, for example, square as viewed from above and made of, for example, aluminum. A protective film 12 (passivation film) is formed on the surface of the semiconductor element 10. The protective film 12 may be, for example, a silicon oxide film or a silicon nitride film.

As illustrated in FIG. 1B, a pillar-shaped electrode terminal 13 is arranged on each electrode pad 11. As illustrated in FIG. 1A, each electrode terminal 13 may be, for example, cylindrical. To ensure the required coupling strength between the electrode terminal 13 and the electrode pad 11, the electrode terminal 13 preferably has the largest possible diameter within the outer dimensions of the electrode pad 11. For example, the electrode pad 11 may be square with each side having a length of 50 μm, and the electrode terminal 13 may have a diameter of 40 μm. In FIG. 1A, the electrode pads 11 and the electrode terminals 13 are illustrated with solid lines so that they can easily be distinguished from other components on the wiring substrate 20 (described later).

As illustrated in FIG. 1B, each electrode terminal 13 includes a barrier layer 14, or an under barrier metal (UBM) layer, which is formed on the corresponding electrode pad 11, and a metal terminal portion 15 formed on the barrier layer 14. In the illustrated example, the axis of the metal terminal portion 15 is perpendicular to the surface of the electrode pad 11. The barrier layer 14 may be made of, for example, titanium (Ti), an alloy of copper (Cu) or a titanium and tungsten (W), or Cu. The barrier layer 14 may be formed by, for example, plating. The metal terminal portion 15 may be made of copper. The metal terminal portion 15 may be formed by, for example, performing plating.

As illustrated in FIG. 1B, the metal terminal portion 15 includes a cylindrical basal portion 16, which is connected to the barrier layer 14, and a distal portion 17, which has a cutout 17a. As viewed along the axis of the electrode terminal 13, the distal portion 17 has a semicircular distal surface or cross-section. The circumference of the distal portion 17 is flush with the circumference of the basal portion 16. In this manner, the electrode terminal 13 includes the basal portion 16 and a guide, which is formed in the distal portion 17. The guide is formed by cutting out part of the cylindrical distal portion 17, the circumference of which is flush with the circumference of the basal portion 16. The distal portion 17 of the electrode terminal 13 may be referred to as a relatively thin distal protrusion, which extends from the basal portion 16 of the electrode terminal 13.

The circumference of the arc in the distal surface of the distal portion 17 is flush with the outer circumference of the basal portion 16. In the example illustrated in FIG. 1B, the distal portion 17 is formed so that the arc in the distal surface is directed toward the outer side of the semiconductor element 10. The cutout 17a of the distal portion 17 is directed toward the inner side of the semiconductor element 10. The cutout 17a is an arc-like curved surface. In another example, the cutout 17a includes an inclined surface. In still another example, the cutout 17a may be defined by an angular surface. A solder layer 18 is formed on the cutout 17a. The solder layer 18 is formed by, for example, performing solder plating.

The wiring substrate 20 includes a substrate body 21, which may be planar. The substrate body 21 may be made of an insulating resin, for example, epoxy resin. A plurality of connecting pads 22 are formed on the upper surface of the substrate body 21 (chip mounting surface, or upper surface in FIG. 1B). The connecting pads 22 may be made of, for example, copper. The connecting pads 22 are respectively connected to the electrode pads 11 of the semiconductor element 10. As illustrated in FIG. 1A, the connecting pads 22 are arranged in a tetragonal frame-shaped array, which includes lines of connecting pads 22, which correspond to the lines of electrode pads 11 formed on the semiconductor element 10.

Each connecting pad 22 is rectangular as viewed from above and elongated in a direction perpendicular to the direction in which the corresponding electrode pad line extends. Each connecting pad 22 has a width (length in the direction of the corresponding connecting pad line, or length in a direction parallel to the corresponding side of the semiconductor element 10) set in accordance with the size (diameter) of the corresponding electrode terminal 13. For example, each connecting pad 22 may have a width of 22 μm and a length of 100 μm (length in the direction perpendicular to the direction of the corresponding connecting pad line).

Each connecting pad 22 is connected to a wire 23 formed on the upper surface of the substrate body 21. Although not illustrated in the drawings, the wiring substrate 20 includes wires and vias, which connect the semiconductor element 10 to other elements. In another example, the wiring substrate 20 is replaced by a substrate (package substrate) that connects the semiconductor element 10 to another wiring substrate.

As illustrated in FIG. 1B, a protective film 24 (solder mask layer) is formed on the upper surface of the substrate body 21. The protective film 24 may be made of, for example, an insulating epoxy resin. As illustrated in FIG. 1A, the protective film 24 includes a tetragonal opening corresponding to the outline of the semiconductor element 10 and exposing the connecting pads 22.

As illustrated in FIG. 1A, the connecting pads 22 are formed so that the center of each connecting pad 22 in its longitudinal direction is aligned with the center of the corresponding electrode pad 11 in the semiconductor element 10. Each electrode terminal 13 is arranged on the center of the corresponding connecting pad 22. In each electrode terminal 13, the distal portion 17 is separated from the longitudinal center of the corresponding connecting pad 22 toward either one of the two sides in the longitudinal direction of the connecting pad 22. For example, the distal portion 17 may be arranged toward the outer side of the semiconductor element 10, with the cutout 17a facing the inner side of the semiconductor element 10.

As illustrated in FIG. 1B, the electrode terminals 13 of the semiconductor element 10 are connected by solder joints 30 to the connecting pads 22 of the wiring substrate 20. The solder forming the solder joints 30 may be, for example, an alloy of tin (Sn) and silver Ag. Alternatively, the solder may be made of an alloy of Sn and zinc (Zn). The shape of the solder joint 30 formed on each connecting pad 22 is determined in accordance with the relative positions of each connecting pad 22 and the corresponding electrode terminal 33.

The operation of the semiconductor element 10 and the wiring substrate 20 will now be described.

Figure 1C:
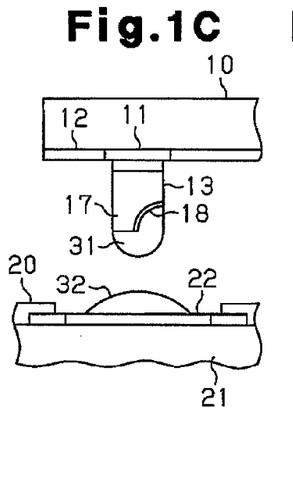
Figure 1D:
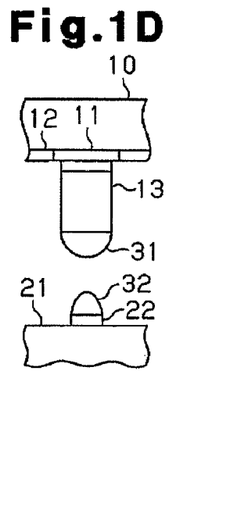

As illustrated in FIGS. 1C and 1D, a solder drop 31 is formed on the distal portion 17 of each electrode terminal 13. The solder drop 31 adheres to the distal surface of the distal portion 17 and the cutout 17a. The adhering solder drop 31 is substantially semispherical and curved downward as illustrated in the drawing. The solder drop 31 is formed in, for example, reflow soldering.

A dome-shaped solder drop 32 is formed on the upper surface of the connecting pad 22 on the wiring substrate 20. The solder drop 32 has a bulging central portion. When a solder base material of the solder drop 32 on the upper surface of the connecting pad 22 is melted, surface tension acts to concentrate the molten solder on the upper surface of the connecting pad 22. This forms the drop of solder 32 with a peak that is substantially aligned with the center of the connecting pad 22. The solder drop 32 may be formed by performing, for example, the SUPER JUFFIT (registered trademark) process.

In one example, the total amount of solder forming the solder drop 31 on the distal end of the electrode terminal 13 and the solder drop 32 adhered to the upper surface of the connecting pad 22 is greater than the amount of solder required to connect the electrode terminal 13 and the connecting pad 22.

Subsequently, the semiconductor element 10 and the wiring substrate 20 are aligned with each other. Then, the semiconductor element 10 is pressed against the wiring substrate 20 under a predetermined pressure. Reflow soldering is performed in this state. The reflow soldering melts the solder drop 31 on the distal end of each electrode terminal 13 and melts the solder drop 32 on the upper surface of the corresponding connecting pad 22. Here, the peak of the solder drop 32 is separated from the distal portion 17 of the electrode terminal 13. Thus, the downward force applied to the electrode terminal 13 causes the solder drop 32 on the upper surface of the connecting pad 22 to flow in a direction determined by the position of the distal portion 17.

As illustrated in FIG. 1A, each connecting pad 22 is rectangular and elongated in the direction perpendicular to the layout direction of the corresponding connecting pad line. The distal portion 17 of each electrode terminal 13 is formed toward the corresponding side of the semiconductor element 10 (outer side) from the center of the connecting pad 22 in the longitudinal direction of the connecting pad 22. Thus, the solder drop 32 on the upper surface of the connecting pad 22 flows along the longitudinal direction of the connecting pad 22 toward the outer side of the semiconductor element 10.

The solder drop 31 and the solder drop 32 are cured to form the solder joint 30 illustrated in FIG. 1B. The solder joint 30 includes subtle or no solder that protrudes from the corresponding connecting pad 22 in the layout direction of the corresponding connecting pad line. This is because the distal portion 17 of the electrode terminal 13 guides the molten solder drops 31 and 32 toward the outside of the semiconductor element 10, that is, toward the circumference of the distal portion 17, which is flush with the circumference of the basal portion 16 and located at the opposite side of the cutout 17a. This reduces short circuiting defect caused by solder between adjacent connecting pads 22.

In an embodiment illustrated in FIG. 1B, the solder joint 30 includes a concave surface and a convex surface. The concave surface is located at the side where the cutout 17a is formed (right side of the electrode terminal 13 in FIG. 1B), and the convex surface is located at the opposite side of the cutout 17a (left side of the electrode terminal 13 in FIG. 1B).

An electrode terminal of a comparative example is cylindrical and has a flat distal surface that is substantially parallel to the upper surface of the corresponding connecting pad 22. In this comparative example, the molten solder drops 31 and 32 can flow in various directions along the distal surface of the electrode terminal and the surface of the connecting pad 22. This may increase the amount of solder that protrudes in the layout direction of the corresponding connecting pad line. The solder protruding in the layout direction of the connecting pad line may connect two adjacent two connecting pads 22 and cause a short circuiting defect.

Figure 2A:
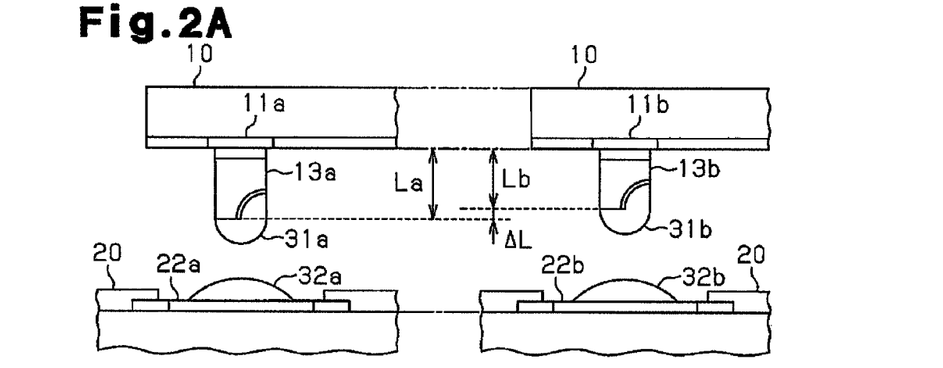
FIGS. 2A and 2B are partially enlarged views of the semiconductor element and the wiring substrate.

The electrode terminals 13 formed in the same semiconductor element 10 may have varying lengths in a manufacturing process. As illustrated in FIG. 2A, for example, an electrode terminal 13a formed on one semiconductor element 10 may have length La, whereas an electrode terminal 13b formed on the same semiconductor element 10 has length Lb, which is shorter than the length La by $\Delta L$. A solder drop 31a is formed on the electrode terminal 13a, and a solder drop 31b is formed on the electrode terminal 13b. The solder drops 31a and 31b are formed through the same processes and thus include the same amount of solder.

Figure 2B:
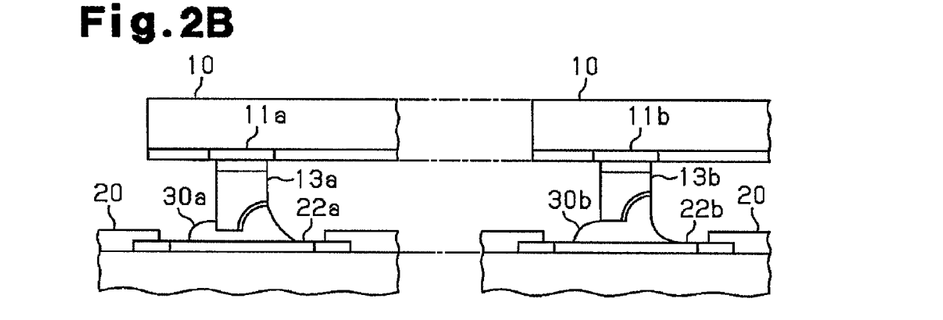

A solder drop 32a is formed on the upper surface of a connecting pad 22a corresponding to the electrode terminal 13a, and a solder drop 32b is formed on the upper surface of a connecting pad 22b corresponding to the electrode terminal 13b. As illustrated in FIG. 2B, the electrode terminal 13a and the connecting pad 22a are electrically connected to each other by a solder joint 30a. In this case, the amount of solder that is moved apart from the solder drop 32b from the electrode terminal 13b is less than the amount of solder moved apart from the solder drop 32a by the electrode terminal 13a. However, the total amount of solder in the solder drops 31b and 32b is the same as the total amount of solder in the solder drops 31a and 31b on the electrode terminal 13a and the connecting pad 22. As a result, the solder drops 31b and 32b remain between the electrode terminal 13b and the connecting pad 22b and electrically connect the electrode terminal 13b and the connecting pad 22b with the solder joint 30b as illustrated in FIG. 2B.

A method for forming the electrode terminal 13 will now be described.

Figure 3A:
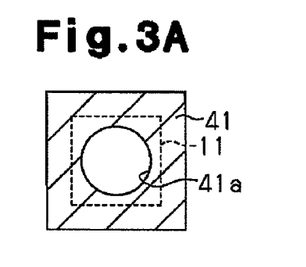
FIGS. 3A and 3B, FIGS. 4A and 4B, FIGS. 5A and 5B, and FIGS. 6A and 6B are schematic diagrams illustrating a method for forming an electrode terminal.
Figure 3B:
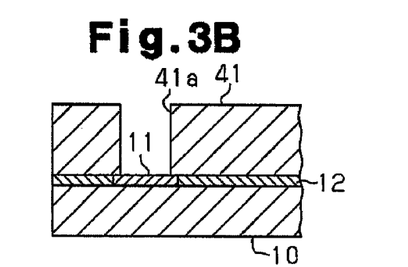

As illustrated in FIGS. 3A and 3B, a resist layer 41 is formed on the semiconductor element 10 on which the electrode pads 11 and the protective film 12 have been formed. Openings 41a are then formed in the resist layer 41. The thickness of the resist layer 41 is equal to the distance from the upper surface of the electrode pad 11 to the distal surface of the electrode terminal 13 (refer to FIG. 1B). The openings 41a are formed to expose the upper surfaces of the electrode pads 11 at portions corresponding to where the electrode terminals 13 are formed. The resist layer 41 may be formed by a photosensitive dry film or a liquid photoresist (liquid resist such as novolac resin or epoxy resin).

Figure 4A:
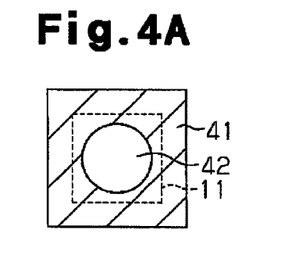
Figure 4B:
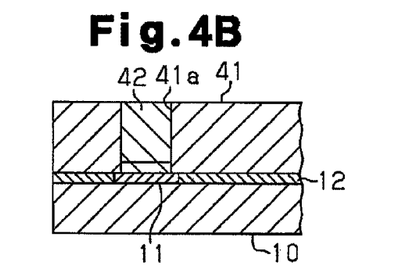

As illustrated in FIGS. 4A and 4B, plating is performed to form a cylindrical electrode part 42 on each electrode pad 11 using the resist layer 41 as a plating mask. More specifically, a barrier layer 14 illustrated in FIG. 1B is formed on the upper surface of the electrode pad 11 that is exposed through the opening 41a of the resist layer 41, and a pillar-shaped metal terminal portion 15 is formed on the barrier layer 14.

Figure 5A:
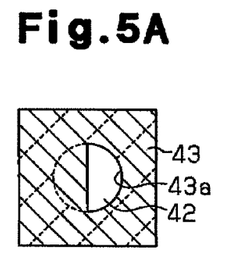
Figure 5B:
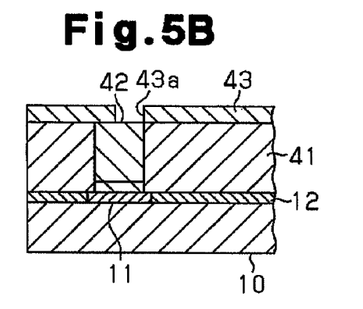

As illustrated in FIGS. 5A and 5B, a resist layer 43 including an opening 43a is formed on the resist layer 41. The resist layer 43 is formed to cover the distal portion 17 illustrated in FIG. 1B. The size, shape, and orientation of the distal portion 17 can be set by the shape of the resist layer 43 (the opening 43a).

Figure 6A:
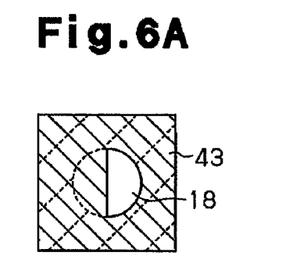
Figure 6B:
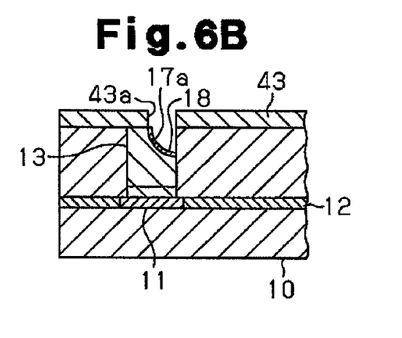

As illustrated in FIGS. 6A and 6B, the electrode part 42 is, for example, etched through the opening 43a of the resist layer 43 to form a curved cutout 17a. The size of the cutout 17a, or the length of the distal portion 17, can be set by the etching conditions (e.g., processing time and concentration of the etching solution).

A solder layer 18 is formed on the cutout 17a by performing, for example, a solder plating process through the opening 43a of the resist layer 43. The resist layers 41 and 43 are then removed by performing, for example, ashing. This forms the electrode terminal 13 including the distal portion 17.

The electrode terminals 13 are formed on the semiconductor element 10 that is still in a wafer state. More specifically, a wafer from which semiconductor elements 10 are formed undergoes the processes illustrated in FIGS. 3A to 6B. This forms the electrode terminals 13 on the electrode pads 11 of the semiconductor elements 10 at the same time. By forming the electrode terminals 13 in this manner, the manufacturing time can be shortened as compared with when forming the bumps with, for example, gold (Au). Gold bumps or the like need to be formed individually and thus require a long time for formation. Also, the use of the mask in the when forming the electrode terminals 13 allows for a shorter pitch between electrode terminals 13 (the distance between the centers of two adjacent electrode terminals 13) as compared with when forming the bumps individually.

The present embodiment has the advantages described below.

(1) The plurality of electrode pads 11 are arranged in a tetragonal frame-shaped array along the periphery of the surface of the semiconductor element 10. The pillar-shaped electrode terminal 13 is formed on each electrode pad 11. The basal portion of each electrode terminal 13 (the basal portion 16 and the barrier layer 14 of the metal terminal portion 15) is connected to the corresponding electrode pad 11. The distal portion 17 of the electrode terminal 13 (the metal terminal portion 15) is semi-cylindrical. The semi-cylindrical distal portion 17 is formed so that the arc at the distal surface faces the outer side of the semiconductor element 10.

The connecting pads 22 and the corresponding electrode pads 11 of the semiconductor element 10 are formed on the wiring substrate 20, on which the semiconductor element 10 is mounted. The center of each connecting pad 22 is substantially aligned with the center of the corresponding electrode pad 11 of the semiconductor element 10. Each connecting pad 22 is rectangular and elongated in a direction perpendicular to the layout direction of the corresponding connecting pad line, or in a direction perpendicular to the corresponding side of the semiconductor element 10.

The solder drop 32 is adhered to the upper surface of each connecting pad 22. The distal portion 17 of each electrode terminal 13 guides the molten solder drops 31 and 32 in the direction opposite to the cutout 17a, or toward the circumference of the distal portion 17, which is flush with the circumference of the basal portion 16. That is, the molten solder drops 31 and 32 are guided toward the outer side of the semiconductor element 10. This reduces the amount of solder that spreads from the solder joint 30 in the layout direction of the corresponding connecting pad line, that is, toward the adjacent connecting pad 22. Thus, short circuit defects caused by spread solder that electrically connects adjacent connecting pads 22d are reduced.

(2) The solder drop 31 is formed on the distal surface of each electrode terminal 13. Reflow soldering is performed to fuse the solder drop 31, which is formed on the electrode terminal 13, and the corresponding solder drop 32, which is adhered to the upper surface of the connecting pad 22, with each other to form the solder joint 30. The amount of solder forming the solder joint 30, specifically, the total amount of the solder forming the solder drop 31 on the electrode terminal 13 and the solder forming the solder drop 32 on the upper surface of the connecting pad 22 is greater than the amount of solder required to connect the electrode terminal 13 and the connecting pad 22.

The electrode terminals 13 formed by performing plating can have varying lengths. Even when the electrode terminal 13b is shorter than the electrode terminal 13a, the solder drops 31b and 32b remain between the electrode terminal 13b and the connecting pad 22b. This ensures that the solder joint 30b electrically connects the electrode terminal 13b and the connecting pad 22b. The increased amount of solder in the solder drops 31a, 31b, 32a, and 32b allows for the electrode terminals 13a and 13b, which have varying lengths, to be connected to the connecting pads 22a and 22b. This reduces defective connections that might occur when electrode terminals have varying lengths.

(3) The solder layer 18 is formed on the cutout 17a of the distal portion 17. The solder layer 18 acts to adhere the molten solder drops 31 and 32 to the cutout 17a. This adheres excess solder to the cutout 17a and reduces undesirable spreading of the solder.

It should be apparent to those skilled in the art that the present invention may be embodied in many other specific forms without departing from the spirit or scope of the invention. Particularly, it should be understood that the present invention may be embodied in the following forms.

Figure 7A:
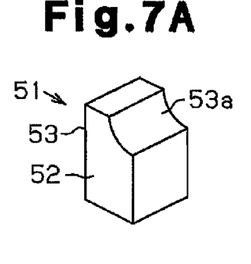
FIGS. 7A to 7C and FIGS. 8A to 8C are schematic diagrams illustrating electrode terminals of various modifications.

The shape of the electrode terminals 13 (refer to FIG. 1A) may be changed. In the example illustrated in FIG. 7A, an electrode terminal 51 has the shape of a tetragonal pillar. The electrode terminal 51 includes a basal portion 52, which has the shape of a tetragonal pillar, and a distal portion 53, which includes a cutout 53a that is defined by a curved surface.

Figure 7B:
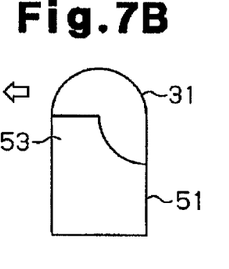

The electrode terminal 51 can be formed by, for example, changing the shape of the opening 41a in the resist layer 41 illustrated in FIG. 3A to a tetragonal shape. The electrode terminal 51 also functions to guide the flow of solder in the direction indicated by an arrow in FIG. 7B and prevents short circuits.

Figure 7C:
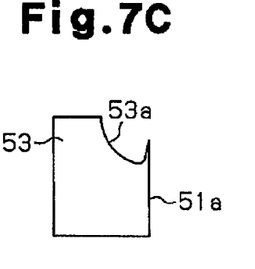

When the distal end of the electrode terminal is etched to form a cutout 53a, burrs or etching residue may form along the resist film (refer to FIG. 6B) as illustrated in FIG. 7C depending on the etching conditions. An electrode terminal 51a including such an etching residue still functions to reduce the amount of solder spread in an undesirable manner as in the above embodiment.

Figure 8A:
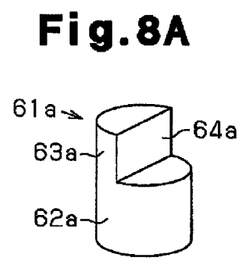
Figure 8B:
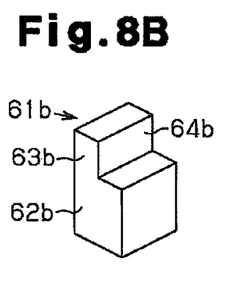
Figure 8C:
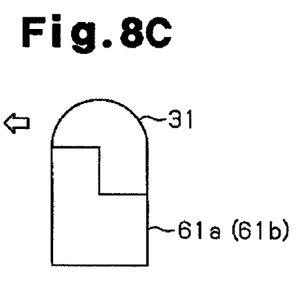

In the above embodiment, the distal portion 17 includes the curved cutout 17a. However, the shape of the cutout 17a may be changed. As illustrated in FIG. 8A, an electrode terminal 61a may have a cylindrical basal portion 62a and a distal portion 63a including a cutout 64a that is defined by an angular surface. As illustrated in FIG. 8B, an electrode terminal 61b may have a basal portion 62b that is formed by a tetragonal pillar and a distal portion 63b including a cutout 64b that is defined by an angled surface. The electrode terminals 61a and 61b also function to guide the flow of solder in the direction indicated by an arrow in FIG. 8C and thus prevent short circuits in the same manner as in the above embodiment.

The electrode terminals 61a and 61b illustrated in FIGS. 8A and 8B can be formed by performing a blasting process through the opening 43a illustrated in FIGS. 6A and 6B.

Alternatively, the electrode terminal 61a can be formed through the processes illustrated in FIGS. 9A to 12B.

Figure 9A:
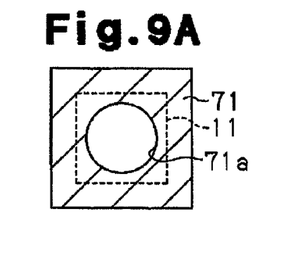
FIGS. 9A and 9B, FIGS. 10A and 10B, FIGS. 11A and 11B, and FIGS. 12A and 12B are schematic diagrams illustrating a method for forming the electrode terminals illustrated in FIGS. 7A to 7C and 8A to 8C.
Figure 9B:
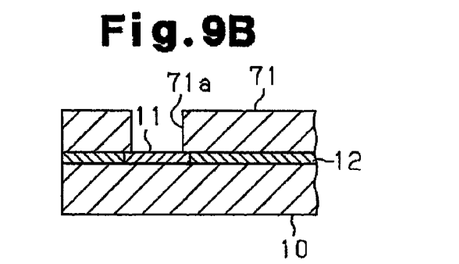

In the processes illustrated in FIGS. 9A and 9B, a resist layer 71 is formed on the semiconductor element 10 on which the electrode pads 11 and the protective film 12 have been formed. Openings 71a are then formed in the resist layer 71. The thickness of the resist layer 71 is equal to the height of the basal portion 62a (refer to FIG. 8A) in each electrode terminal 61a. The openings 71a are formed to expose parts of the upper surfaces of the corresponding electrode pad 11 where the electrode terminals 13 are formed. The resist layer 71 may be formed from a photosensitive dry film or a liquid photoresist (liquid resist such as novolac resin or epoxy resin).

Figure 10A:
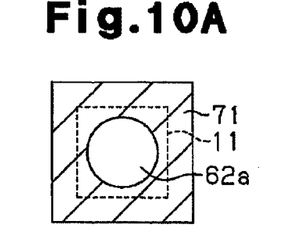
Figure 10B:
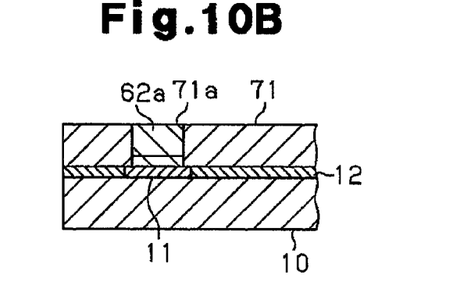

As illustrated in FIGS. 10A and 10B, plating is performed to form the cylindrical basal portion 62a using the resist layer 71 as a plating mask.

Figure 11A:
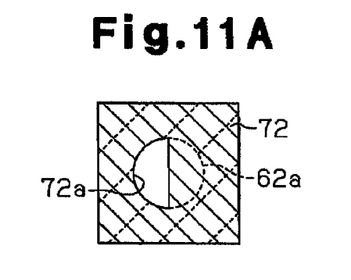
Figure 11B:
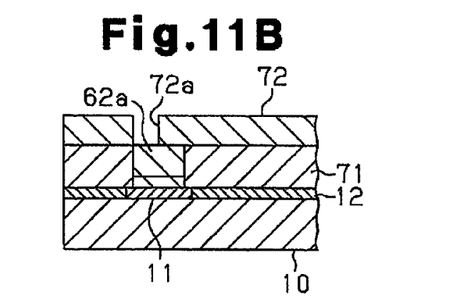

As illustrated in FIGS. 11A and 11B, a resist layer 72 having an opening 72a is formed on the resist layer 71. The resist layer 72 is shaped in conformance with the distal portion 63a illustrated in FIG. 8A. The size, shape, and orientation of the distal portion 63a can be set by changing the shape of the resist layer 72 (the opening 72a).

Figure 12A:
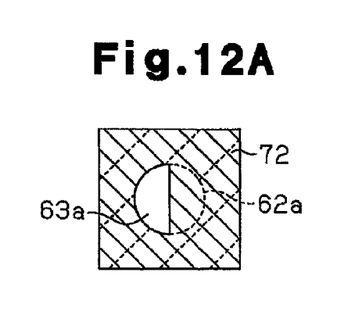
Figure 12B:
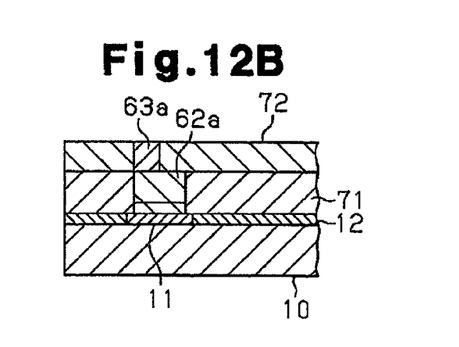

As illustrated in FIGS. 12A and 12B, plating is performed to form the semi-cylindrical distal portion 63a using the resist layer 72 as a plating mask.

Then, an ashing process is performed to remove the resist layers 71 and 72. This completes the electrode terminal 61a including the distal portion 63a with the cutout 64a formed by flat surfaces.

The electrode terminal 61b illustrated in FIG. 8B can be formed by changing the shape of the openings 71a and 72a formed in the resist layers 71 and 72 to a rectangular shape in the processes illustrated in FIGS. 9A to 12B. The shape of the openings 71a and 72b may be changed to form electrode terminals with guides of different shapes, such as a semicircular guide, a rectangular guide, and a triangular guide.

In the above embodiment, the electrode terminal guides the flow of the molten solder in a single direction. Alternatively, the electrode terminal may guide the flow of the solder in two or more directions.

Figure 13A:
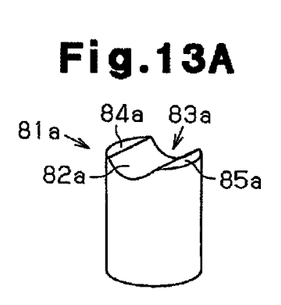
FIGS. 13A to 13C are perspective views illustrating electrode terminals according to various modifications.

FIG. 13A illustrates an example of a cylindrical electrode terminal 81a. A groove 83a extends through the middle of the distal surface of the electrode terminal 81a in a predetermined direction.

The groove 83a forms a cutout 82a in the distal surface of the electrode terminal 81a. The cutout 82a is arc-shaped as viewed from the side. The width of the groove 83a, which corresponds to the interval between distal ends 84a and 85a formed on the two sides of the groove 83a, may be set to be greater than or equal to the width of the corresponding connecting pad 22 illustrated in FIG. 1A. The electrode terminal 81a is formed on the electrode pad 11 so that the groove 83a extends along the longitudinal direction of the connecting pad 22. Solder drops are then adhered to the groove 83a and the distal ends 84a and 85a of the electrode terminal 81a.

When a semiconductor element including the electrode terminals 81a is mounted onto the wiring substrate 20, the groove 83a formed between the distal ends 84a and 85a of each electrode terminal 81a guides the flow of the solder along the longitudinal direction of the groove 83a. The distal ends 84a and 85a of each electrode terminal 81a function as two guides. The electrode terminal 81a is formed so that the solder flow is guided in the longitudinal direction of the connecting pad 22. This reduces the amount of solder that spreads in an undesirable manner in the widthwise direction of the connecting pad 22, or in the direction of the corresponding connecting pad line. This prevents short circuits caused by excess solder.

Figure 13B:
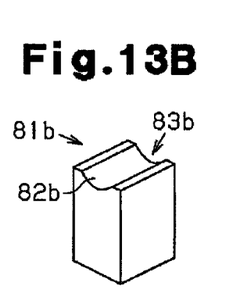
Figure 13C:
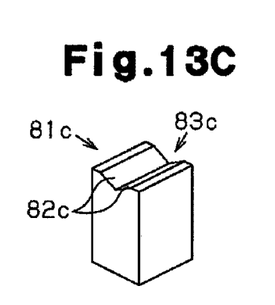

FIG. 13B illustrates an electrode terminal 81b having the shape of a tetragonal pillar. The electrode terminal 81b may include a cutout 82b defined by a groove 83b in the distal end. FIG. 13C illustrates an electrode terminal 81c having the shape of a tetragonal pillar. The electrode terminal 81c may include, in its distal end, two cutouts 82c that are defined by inclined surfaces and form a groove 83c. In another example, an electrode terminal may include a cutout defined by a rectangular groove in its distal end.

An example of a method for forming the electrode terminal 81a illustrated in FIG. 13A will now be described.

Figure 14A:
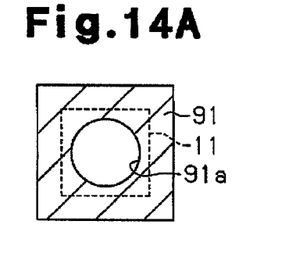
FIGS. 14A and 14B, FIGS. 15A and 15B, FIGS. 16A and 16B, and FIGS. 17A and 17B are schematic diagrams illustrating a method for forming the electrode terminals illustrated in FIGS. 13A to 13C.
Figure 14B:
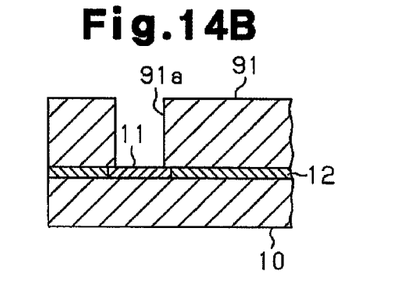

As illustrated in FIGS. 14A and 14B, a resist layer 91 is formed on the semiconductor element 10, on which the electrode pads 11 and the protective film 12 have been formed. Openings 91a are then formed in the resist layer 91. The openings 91a are formed to expose parts of the upper surfaces of the electrode pads 11 corresponding to where the electrode terminals 81a are formed. The resist layer 91 may be formed from a photosensitive dry film or a liquid photoresist (liquid resist such as novolac resin or epoxy resin).

Figure 15A:
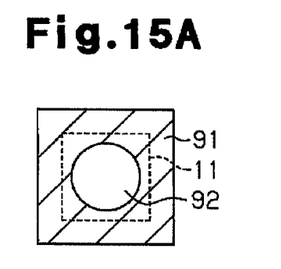
Figure 15B:
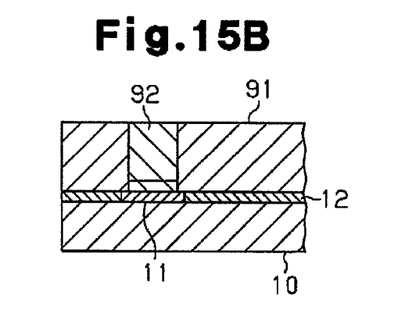

As illustrated in FIGS. 15A and 15B, plating is performed to form a cylindrical electrode part 92 on each electrode pad 11 using the resist layer 91 as a plating mask.

Figure 16A:
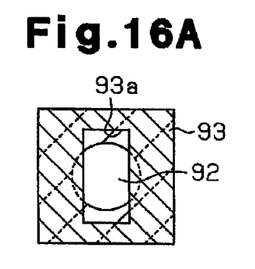
Figure 16B:
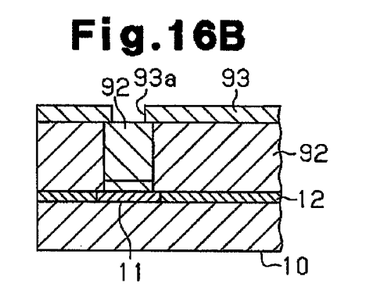

As illustrated in FIGS. 16A and 16B, a resist layer 93 having an opening 93a is formed on the resist layer 91. The resist layer 93 covers the distal ends 84a and 85a illustrated in FIG. 13A. The size and shape of the distal ends 84a and 85a and the orientation of the groove 83a illustrated in FIG. 13A can be set by changing the shape of the resist layer 93 (opening 93a).

Figure 17A:
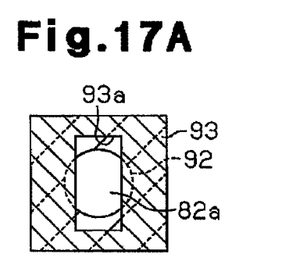
Figure 17B:
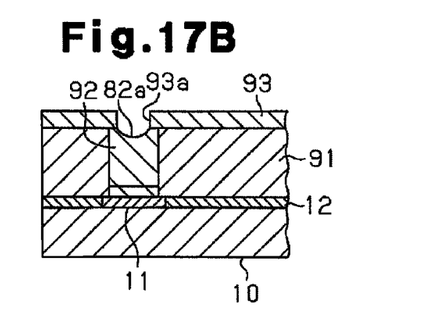

As illustrated in FIGS. 17A and 17B, the electrode part 92 is, for example, etched through the opening 93a of the resist layer 93 to form a curved bottom surface 82a. The depth of the bottom surface 82a can be set by changing the time during which etching is performed.

A solder layer is formed on the bottom surface 82a by performing, for example, solder plating through the opening 93a of the resist layer 93. The resist layers 91 and 93 are then removed by performing, for example, ashing. This completes the electrode terminal 81a illustrated in FIG. 13A.

The electrode terminal 81b illustrated in FIG. 13B can be formed by changing the shape of the opening 91a in the resist layer 91 to a tetragonal shape. Instead of the etching described with reference to FIGS. 17A and 17B, another process such as blasting may be performed. The electrode terminal can have distal end including a groove shaped in accordance with the process that is performed.

Figure 18A:
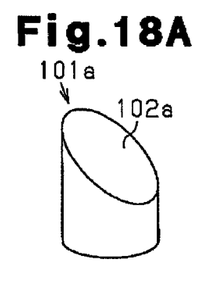
FIGS. 18A to 18C are schematic diagrams illustrating electrode terminals of other modifications.
Figure 18B:
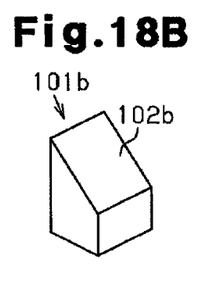
Figure 18C:
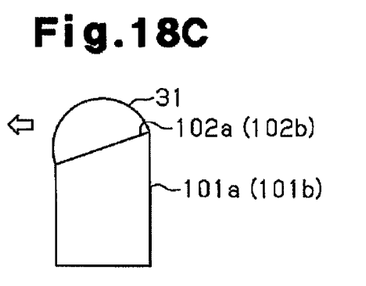

The distal surface of the electrode terminal may be a flat surface inclined with respect to the axis of the electrode terminal. In the example illustrated in FIG. 18A, an electrode terminal 101a is cylindrical and includes a distal surface 102a inclined in a predetermined direction. In the example illustrated in FIG. 18B, an electrode terminal 101b has the shape of a tetragonal pillar and includes a distal surface 102b inclined in a predetermined direction. As illustrated in FIG. 18C, the electrode terminals 101a and 101b guide the flow of solder in the inclined directions of the distal surfaces 102a and 102b.

Figure 19A:
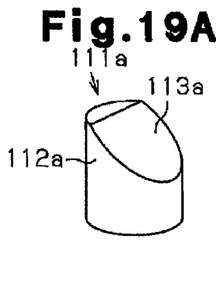
FIGS. 19A to 19C are schematic diagrams illustrating electrode terminals of other modifications.

In another example, the distal surface of an electrode terminal may include a flat surface perpendicular to the axis of the electrode terminal and an inclined part inclined with respect to the axis of the electrode terminal. In the example illustrated in FIG. 19A, an electrode terminal 111a is substantially cylindrical and has a distal surface including an inclined surface 113a, which is formed by diagonally cutting part of a distal portion 112a of the cylinder, and a flat surface, which excludes the inclined surface 113a.

Figure 19B:
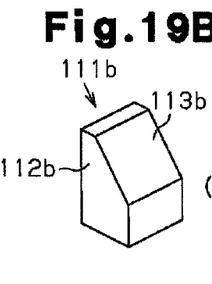

In the example illustrated in FIG. 19B, an electrode terminal 111b is a tetragonal pillar and has a distal surface including an inclined surface 113b, which is formed by diagonally cutting part of a distal portion 112b of the tetragonal pillar, and a flat surface, which excludes the inclined surface 113b.

Figure 19C:
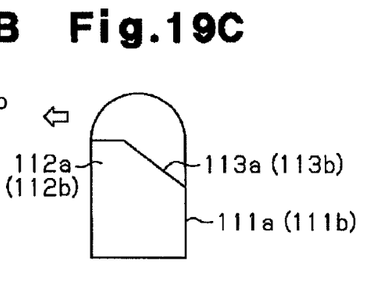

As illustrated in FIG. 19C, the electrode terminals 111a and 111b guide the flow of the solder in the directions of the distal portions 112a and 112b.

Figure 20A:
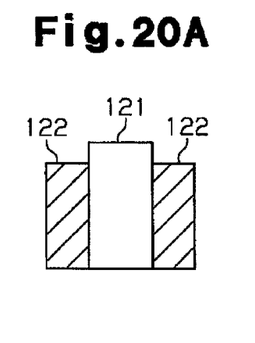
FIGS. 20A and 20B are schematic diagrams illustrating a method for forming the electrode terminals illustrated in FIGS. 18A and 18B and FIGS. 19A and 19B.
Figure 20B:
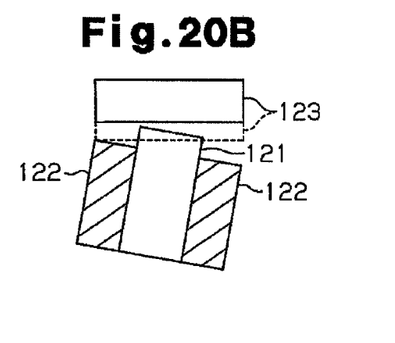

The electrode terminals illustrated in FIGS. 18A and 18B and 19A and 19B may be, for example, formed through the processes illustrated in FIGS. 20A and 20B. As illustrated in FIG. 20A, a pillar-shaped metal terminal 121 is formed in a semiconductor element, and a resist layer 122 is formed on the metal terminal 121 so that a distal portion of the metal terminal 121 protrudes from the resist layer 122. As illustrated in FIG. 20B, the semiconductor element including the metal terminal 121 is held on a tilted stage, and the metal terminal 121 is polished by a polishing head 123 used for chemical mechanical polishing (CMP), for example, to form an inclined surface on the distal end of the metal terminal 121.

The surface of the metal terminal 121 can be inclined relative to the axis of the metal terminal 121 at an angle set by changing the relative angle of the stage and the head 123. The resist layer 122 functions as a stopper and restricts the amount of the metal terminal 121 protruding from the resist layer 122. This sets the size of the inclined surface. In another example, the polishing time is adjusted to set the size of the inclined surface.

Figure 21A:
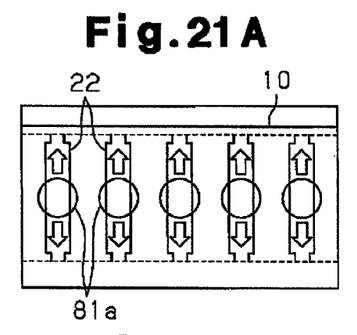
FIGS. 21A to 21D are schematic diagrams illustrating the directions in which solder flows.

In the above embodiment and modifications, the direction in which the flow of solder is guided may be changed. For example, the electrode terminal 81a illustrated in FIG. 13A can guide the solder in two opposite directions from the electrode terminal 81a along the length of the connecting pad 22 as indicated by thick arrows in FIG. 21A. This reduces the amount of solder undesirably spreading between the adjacent connecting pads 22, and thus prevents short circuits caused by solder.

Figure 21B:
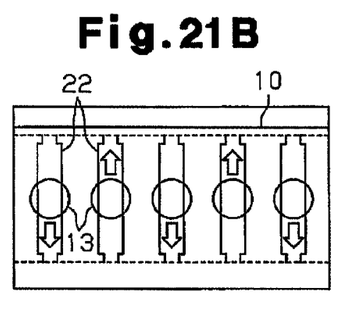

Alternatively, electrode terminals that guide the flow of solder in one direction (electrode terminal 13 illustrated in FIG. 1B) may be used so that the electrode terminals corresponding to adjacent connecting pads 22 guide the flow of solder in opposite directions as illustrated by the arrows in FIG. 21B. In this case, the guided solder may be spread in the widthwise direction of the connecting pads 22. However, the solder drops of the adjacent connecting pads 22 spread at different positions in the longitudinal direction of the connecting pads 22. Thus, the solder drops of adjacent connecting pads 22 do not come into contact, and short circuits caused by solder are reduced.

Figure 21C:
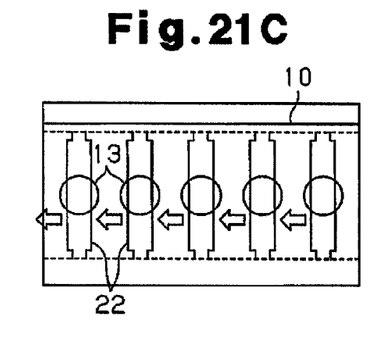

Alternatively, the electrode terminals 13 may guide the flow of solder in the direction of the corresponding connecting pad line as indicated by the arrows in FIG. 21C.

Figure 21D:
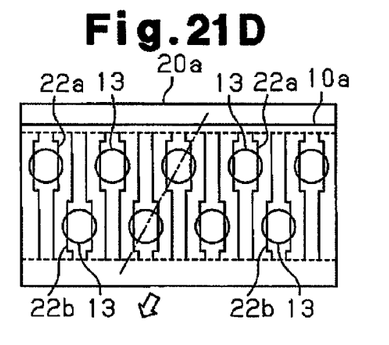

FIG. 21D illustrates connecting pads 22a, which correspond to electrode terminals 13 located at a first distance from an edge of a semiconductor element 10a, and connecting pads 22b, which correspond to electrode terminals 13 located at a second distance from the edge, alternately arranged in a zigzag pattern along the periphery of the semiconductor element 10a. In this layout, the electrode terminals may be formed to guide the solder drops in one direction along a straight line extending through the centers of adjacent connecting pads 22a and 22b. Alternatively, the electrode terminals may be arranged on the connecting pads 22a and 22b in a zigzag pattern so that the electrode terminals corresponding to adjacent connecting pads guide the flow of solder in opposite directions in the same manner as described with reference to FIGS. 21B.

Figure 22A:
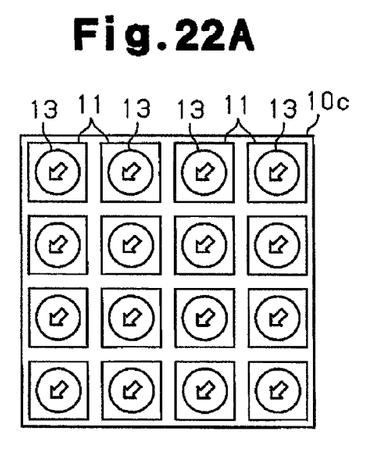
FIGS. 22A and 22B are schematic diagrams illustrating the directions in which solder flows.
Figure 22B:
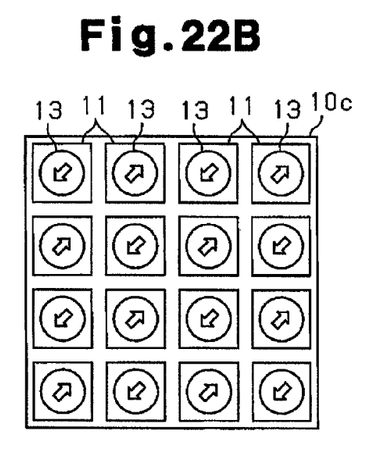

In the above embodiment, the semiconductor element uses the peripheral arrangement, and the semiconductor device includes the wiring substrate on which the semiconductor element using the peripheral arrangement is mounted. Alternatively, the electrode terminals of the above embodiment may be formed in a semiconductor element in which the electrode pads are laid out in an arrangement other than the peripheral arrangement. For example, the present invention is applicable to the case in which a semiconductor element in which the electrode pads 11 are arranged in a matrix is mounted on the wiring substrate. In such a semiconductor element 10c, for example, the electrode terminals 13 formed on the electrode pads 11 may guide the solder in one direction (e.g., along one diagonal line of each electrode pad 11) as illustrated by the arrows in FIG. 22A. As illustrated in FIG. 22B, the electrode terminals 13 may be formed so that the electrode terminals 13 corresponding to adjacent electrode pads 11 guide the flow of solder in opposite directions.

The shape of the electrode terminals is not limited to a cylinder or a tetragonal pillar and may be a polygonal pillar having five or more sides.

It should be apparent to those skilled in the art that the present invention may be embodied in many other specific forms without departing from the spirit or scope of the invention. Particularly, it should be understood that the present invention may be embodied in the following forms.

The invention claimed is:

1. A semiconductor device comprising:
    a semiconductor element on which a plurality of electrode pads are laid out;
    a wiring substrate including a plurality of connecting pads respectively arranged in correspondence with the plurality of electrode pads;
    a plurality of cylindrical pillar-shaped electrode terminals respectively formed on the plurality of electrode pads of the semiconductor element; and
    a solder joint that electrically connects a distal portion of each electrode terminal and the corresponding connecting pad on the wiring substrate,
    wherein each electrode terminal includes a basal portion, which is connected to the corresponding electrode pad, and a guide, which is formed in the distal portion, the guide including a cutout formed so that apart of an original peripheral surface of the cylindrical pillar-shaped electrode terminal remains as an arcuate peripheral surface of the guide in the distal portion, the guide has a smaller cross-sectional area than the basal portion as viewed from above, the basal portion has a circumference that is partially flush with the arcuate peripheral surface of the guide to form a same plane, the entire arcuate peripheral surface of the guide and the entire circumference of the basal portion are parallel to a longitudinal axis of the cylindrical pillar-shaped electrode terminal, and the guide is formed to guide solder toward the arcuate peripheral surface of the guide.

2. The semiconductor device according to claim 1, wherein the electrode pads are laid out to form a plurality of electrode pad lines,
    each connecting pad is rectangular and elongated in a direction perpendicular to a layout direction of the one of the electrode pad lines including the corresponding electrode pad, and
    the guide is formed to guide solder in a longitudinal direction of the corresponding connecting pad and the arcuate peripheral surface faces toward the longitudinal direction of the corresponding connecting pad.

3. The semiconductor device according to claim 2, wherein the electrode terminals each include a single guide, and
    the guides of the electrode terminals are formed to guide solder from adjacent ones of the electrode pads in the same direction.

4. The semiconductor device according to claim 2, wherein the electrode terminals each include a single guide, and
    the guides of the electrode terminals are formed to guide solder from adjacent ones of the electrode pads in opposite directions.

5. The semiconductor device according to claim 1, wherein a solder drop is formed on the cutout of each electrode terminal.

6. A semiconductor element, comprising:
    a plurality of electrode pads laid out on a surface; and
    a plurality of cylindrical pillar-shaped electrode terminals respectively connected to the plurality of electrode pads, wherein each electrode terminal includes a basal portion, which is connected to the corresponding electrode pad, and distal portion, which includes a guide, the guide including a cutout formed so that a part of an original peripheral surface of the cylindrical pillar-shaped electrode terminal remains as an arcuate peripheral surface of the guide in the distal portion, the guide has a smaller cross-sectional area, as viewed from above, than the basal portion, the basal portion has a circumference that is partially flush with the arcuate peripheral surface of the guide to form a same plane, the entire arcuate peripheral surface of the guide and the entire circumference of the basal portion are parallel to a longitudinal axis of the cylindrical pillar-shaped electrode terminal, and the guide of each electrode terminal is electrically connected by solder to a connecting pad corresponding to the electrode pad formed on a wiring substrate.

7. The semiconductor element according to claim 6, wherein a solder layer is formed on the cutout of each electrode terminal.

8. A method for manufacturing a semiconductor device, the method comprising:

preparing a semiconductor element on which a plurality of electrode pads are laid out;

preparing a wiring substrate including a plurality of connecting pads respectively arranged in correspondence with the plurality of electrode pads;

forming a plurality of cylindrical pillar-shaped electrode terminals on the plurality of electrode pads, respectively, wherein each electrode terminal includes a basal portion, which is connected to the corresponding electrode pad, and a distal portion, which includes a guide, the guide including a cutout formed so that a part of an original peripheral surface of the cylindrical pillar-shaped electrode terminal remains as an arcuate peripheral surface of the guide in the distal portion, the guide has a smaller cross-sectional area than the basal portion as viewed from above, and the basal portion has a circumference that is partially flush with the arcuate peripheral surface of the guide to form a same plane, the entire arcuate peripheral surface of the guide and the entire circumference of the basal portion are parallel to a longitudinal axis of the cylindrical pillar-shaped electrode terminal; and electrically connecting the guide and the corresponding connecting pad with a solder joint, wherein the electrically connecting the guide and the connecting pad includes guiding solder toward the arcuate peripheral surface of the guide.

9. The method according to claim 8, wherein the forming a plurality of pillar-shaped electrode terminals includes forming the guides of adjacent ones of the electrode terminals to guide solder in the same direction.

10. The method according to claim 8, wherein the forming a plurality of pillar-shaped electrode terminals includes forming the guides of adjacent ones of the electrode terminals to guide solder from the adjacent ones of the electrode pads in opposite directions.

11. The method according to claim 8, wherein a solder drop is formed on the cutout of each electrode terminal.

12. A semiconductor device comprising:

a plurality of electrode pads;

a plurality of cylindrical pillar-shaped electrode terminals respectively formed on the plurality of electrode pads;

a substrate including a plurality of connecting pads respectively arranged in correspondence with the plurality of electrode pads; and a plurality of solder joints each electrically connecting a distal portion of one of the cylindrical pillar-shaped electrode terminals and the corresponding connecting pad, wherein each electrode terminal includes a cutout formed in the distal portion so that a part of an original peripheral surface of the cylindrical pillar-shaped electrode terminal remains as an arcuate peripheral surface of the guide in the distal portion, the basal portion has a circumference that is partially flush with the arcuate peripheral surface to form a same plane, the entire arcuate peripheral surface of the guide and the entire circumference of the basal portion are parallel to a longitudinal axis of the cylindrical pillar-shaped electrode terminal, and the cutout is formed to have a curved surface, an inclined surface, or an angled surface.

13. The semiconductor device according to claim 12, wherein each solder joint includes a concave surface, which is arranged at a side of the cutout in the corresponding electrode terminal, and a convex surface, which is arranged at an opposite side of the cutout.

14. The semiconductor device according to claim 12, wherein the cutout is formed to guide molten solder that is in contact with the distal portion of the corresponding electrode terminal toward the arcuate peripheral surface.

15. The semiconductor device according to claim 12, wherein a solder drop is formed on the cutout of each electrode terminal.

* * * * *